US010884989B2

(12) United States Patent
Asmussen et al.

(10) Patent No.: US 10,884,989 B2
(45) Date of Patent: *Jan. 5, 2021

(54) TAPE DRIVE MEMORY DEDUPLICATION

(71) Applicant: INTERNATIONAL BUSINESS MACHINES CORPORATION, Armonk, NY (US)

(72) Inventors: Ole Asmussen, Henstedt-Ulzburg (DE); Robert Beiderbeck, Wassenberg (DE); Erik Rueger, Ockenheim (DE); Markus Schaefer, Heiligenmoschel (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/416,473

(22) Filed: May 20, 2019

(65) Prior Publication Data

US 2019/0272257 A1    Sep. 5, 2019

Related U.S. Application Data

(63) Continuation of application No. 15/701,994, filed on Sep. 12, 2017, now Pat. No. 10,372,681.

(51) Int. Cl.
*G06F 3/06* (2006.01)
*G06F 16/174* (2019.01)
*H03M 7/30* (2006.01)
*G06F 11/14* (2006.01)

(52) U.S. Cl.
CPC .......... *G06F 16/1744* (2019.01); *G06F 3/067* (2013.01); *G06F 3/0608* (2013.01); *G06F 3/0641* (2013.01); *G06F 3/0682* (2013.01); *G06F 11/1453* (2013.01);
(Continued)

(58) Field of Classification Search
None
See application file for complete search history.

(56) References Cited

U.S. PATENT DOCUMENTS 8,311,964 B1    11/2012  Efstathopoulos
8,667,235 B2     3/2014  Williams
8,682,868 B2     3/2014  Ghuge
(Continued)

OTHER PUBLICATIONS

Friedman, Mark J.; List of IBM Patents or Patent Applications Treated as Related; May 20, 2019; 1 page.

*Primary Examiner* — Kevin Verbrugge
(74) *Attorney, Agent, or Firm* — Schmeiser, Olsen & Watts; Nicholas L. Cadmus

(57) ABSTRACT

A method and system for improving tape drive memory storage is provided. The method includes receiving, by a storage tape drive, a data stream for storage. The data stream is passed through a non-volatile memory device (NVS2) of the storage tape drive. The data stream is divided into adjacent variable length data chunks and a chunk list file including similarity identifiers for each of the adjacent variable length data chunks is generated and stored within a (non-volatile memory device) NVS1. Duplicate data including duplicated data with respect to a group of data chunks of the adjacent variable length data chunks is identified and deleted from the NVS2 of the storage tape drive such that the group of data chunks remains within NVS2. The group of data chunks is written to a data storage tape cartridge. Pointers identifying each data chunk and an associated storage position are generated and stored.

25 Claims, 9 Drawing Sheets

(52) U.S. Cl.
CPC ...... *G06F 16/1752* (2019.01); *H03M 7/3091* (2013.01); *H03M 7/3095* (2013.01)

(56) References Cited

U.S. PATENT DOCUMENTS

| | | |
|---|---|---|
| 8,694,703 B2 | 4/2014 | Hans |
| 8,849,955 B2 | 9/2014 | Prahlad |
| 9,128,951 B1 | 9/2015 | Agrawal |
| 9,401,967 B2 | 7/2016 | Sabaa |
| 9,417,811 B2 | 8/2016 | Fiske |
| 9,514,146 B1 | 12/2016 | Wallace et al. |
| 10,289,335 B2 | 5/2019 | Asmussen |
| 2012/0047328 A1 | 2/2012 | Williams |
| 2012/0131025 A1 | 5/2012 | Cheung |
| 2013/0144845 A1 | 6/2013 | Ghuge |
| 2013/0238876 A1 | 9/2013 | Fiske |
| 2014/0052907 A1 | 2/2014 | Starr |
| 2014/0114934 A1 | 4/2014 | Chakraborty |
| 2014/0340778 A1 | 11/2014 | Hana et al. |
| 2015/0012503 A1 | 1/2015 | Akirav |
| 2015/0317083 A1 | 11/2015 | Phan |
| 2016/0078068 A1 | 3/2016 | Agrawal |
| 2016/0246537 A1 | 8/2016 | Kim |
| 2017/0123711 A1 | 5/2017 | Kathpal et al. |
| 2017/0255525 A1 | 9/2017 | Dain |
| 2017/0286233 A1 | 10/2017 | Dain |
| 2019/0079690 A1 | 3/2019 | Asmussen |
| 2019/0079947 A1 | 3/2019 | Asmussen |

TAPE DRIVE MEMORY DEDUPLICATION

CROSS REFERENCE TO RELATED APPLICATIONS

This application is a continuation application claiming priority to Ser. No. 15/701,994 filed Sep. 12, 2017, now U.S. Pat. No. 10,372,681, issued Aug. 6, 2019, the contents of which are hereby incorporated by reference.

FIELD

The present invention relates generally to a method for efficiently de-duplicating data stored on a tape drive and in particular to a method and associated system for integrating de-duplication memory devices within a tape drive hardware device for temperately storing de-duplication data chunks and associated reference pointers.

BACKGROUND

Processes for implementing a data deduplication environment are well known. A typical data deduplication environment for random accessible storage systems such as disk drives and flash memory typically includes a data chunk database including information identifying data chunks and associated metadata. A large number of solutions currently exist with respect to de-duplicating data stored on disk drives and flash memory as the aforementioned memory structures allow a process for de-duplicating data to be performed at any time as the data may be accessed without any delay. In tape storage environments data is usually written once in a sequential manner that includes a read delay due to a positioning of a tape to with respect to a read/write head. A large number of solutions currently exist with respect to de-duplicating data in multiple storage media However, the aforementioned solutions may be associated with tape drive storage limitations and speed issues thereby limiting a performance of de-duplication systems. Additionally, the aforementioned solutions may not be enabled to allow for tape drive data compression.

Accordingly, there exists a need in the art to provide a process for compressing data via a de-duplication method executed on a tape drive storage device. Additionally, there exists a need in the art to provide a specialized tape drive hardware structure for compressing data via a de-duplication method.

SUMMARY

A first aspect of the invention provides a tape drive memory storage improvement method comprising: receiving, by a processor of a storage tape drive hardware device, a data stream for storage, wherein the storage tape drive hardware device internally comprises a deduplication software engine, a first non-volatile memory device (NVS1), a second non-volatile memory device (NVS2), and a first data storage tape cartridge; passing, by the processor through the NVS2, the data stream; dividing, by the processor executing the deduplication software engine within the NVS2, the data stream into a plurality of adjacent variable length data chunks; generating, by the processor, a chunk list file comprising similarity identifiers associated with each of the plurality of adjacent variable length data chunks; storing, by the processor within the NVS1, the chunk list file; identifying, by the processor, duplicate data chunks of the plurality of adjacent variable length data chunks, wherein the duplicate data chunks comprise duplicated data with respect to a first group of data chunks of the plurality of adjacent variable length data chunks; deleting, by the processor from the NVS2, the duplicate data chunks such that the first group of data chunks remain within the NVS2; writing, by the processor from the NVS2 to the first data storage tape cartridge, the first group of data chunks for storage; generating, by the processor, pointers identifying each data chunk of the first group of data chunks and an associated storage position, within the first data storage tape cartridge, for each the data chunk of the first group of data chunks; storing, by the processor, the pointers within the chunk list file located within the NVS1; and writing, by the processor from the NVS1 to the first data storage tape cartridge, the chunk list file comprising the pointers for storage.

A second aspect of the invention provides a computer program product, comprising a computer readable hardware storage device storing a computer readable program code, the computer readable program code comprising an algorithm that when executed by a processor of a storage tape drive hardware device implements a tape drive memory storage improvement method, the method comprising: receiving, by the processor, a data stream for storage, wherein the storage tape drive hardware device internally comprises a deduplication software engine, a first non-volatile memory device (NVS1), a second non-volatile memory device (NVS2), and a first data storage tape cartridge; passing, by the processor through the NVS2, the data stream; dividing, by the processor executing the deduplication software engine within the NVS2, the data stream into a plurality of adjacent variable length data chunks; generating, by the processor, a chunk list file comprising similarity identifiers associated with each of the plurality of adjacent variable length data chunks; storing, by the processor within the NVS1, the chunk list file; identifying, by the processor, duplicate data chunks of the plurality of adjacent variable length data chunks, wherein the duplicate data chunks comprise duplicated data with respect to a first group of data chunks of the plurality of adjacent variable length data chunks; deleting, by the processor from the NVS2, the duplicate data chunks such that the first group of data chunks remain within the NVS2; writing, by the processor from the NVS2 to the first data storage tape cartridge, the first group of data chunks for storage; generating, by the processor, pointers identifying each data chunk of the first group of data chunks and an associated storage position, within the first data storage tape cartridge, for each the data chunk of the first group of data chunks; storing, by the processor, the pointers within the chunk list file located within the NVS1; and writing, by the processor from the NVS1 to the first data storage tape cartridge, the chunk list file comprising the pointers for storage.

A third aspect of the invention provides a storage tape drive hardware device comprising a processor coupled to a computer-readable memory unit, the memory unit comprising instructions that when executed by the processor implements a tape drive memory storage improvement method comprising: receiving, by the processor, a data stream for storage, wherein the storage tape drive hardware device internally comprises a deduplication software engine, a first non-volatile memory device (NVS1), a second non-volatile memory device (NVS2), and a first data storage tape cartridge; passing, by the processor through the NVS2, the data stream; dividing, by the processor executing the deduplication software engine within the NVS2, the data stream into a plurality of adjacent variable length data chunks; generating, by the processor, a chunk list file comprising similarity identifiers associated with each of the plurality of adjacent variable length data chunks; storing, by the processor within the NVS1, the chunk list file; identifying, by the processor, duplicate data chunks of the plurality of adjacent variable length data chunks, wherein the duplicate data chunks comprise duplicated data with respect to a first group of data chunks of the plurality of adjacent variable length data chunks; deleting, by the processor from the NVS2, the duplicate data chunks such that the first group of data chunks remain within the NVS2; writing, by the processor from the NVS2 to the first data storage tape cartridge, the first group of data chunks for storage; generating, by the processor, pointers identifying each data chunk of the first group of data chunks and an associated storage position, within the first data storage tape cartridge, for each the data chunk of the first group of data chunks; storing, by the processor, the pointers within the chunk list file located within the NVS1; and writing, by the processor from the NVS1 to the first data storage tape cartridge, the chunk list file comprising the pointers for storage.

A fourth aspect of the invention provides a tape drive memory storage improvement method comprising: receiving, by a processor of a storage tape drive hardware device, a data file for storage, wherein the storage tape drive hardware device internally comprises a deduplication software engine, a first non-volatile memory device (NVS1), a second non-volatile memory device (NVS2), and a first data storage tape cartridge; dividing, by the processor executing the deduplication software engine, the data file into a plurality of adjacent variable length data chunks; identifying, by the processor executing the deduplication software engine, duplicate data chunks of the plurality of adjacent variable length data chunks, wherein the duplicate data chunks comprise duplicated data with respect to a first group of data chunks of the plurality of adjacent variable length data chunks; storing, by the processor within a first database within the NVS2, the first group of data chunks; generating, by the processor, pointers identifying each data chunk of the first group of data chunks and an associated storage position, within the first database of the NVS2, for each the data chunk of the first group of data chunks; storing, by the processor within a second database within the NVS1, the pointers; first writing, by the processor from the NVS2 to the first data storage tape cartridge, the first group of data chunks for storage; and second writing, by the processor from the NVS1 to the first data storage tape cartridge, the pointers.

A fifth aspect of the invention provides a computer program product, comprising a computer readable hardware storage device storing a computer readable program code, the computer readable program code comprising an algorithm that when executed by a processor of a storage tape drive hardware device implements a tape drive memory storage improvement method, the method comprising: receiving, by the processor, a data file for storage, wherein the storage tape drive hardware device internally comprises a deduplication software engine, a first non-volatile memory device (NVS1), a second non-volatile memory device (NVS2), and a first data storage tape cartridge; dividing, by the processor executing the deduplication software engine, the data file into a plurality of adjacent variable length data chunks; identifying, by the processor executing the deduplication software engine, duplicate data chunks of the plurality of adjacent variable length data chunks, wherein the duplicate data chunks comprise duplicated data with respect to a first group of data chunks of the plurality of adjacent variable length data chunks; storing, by the processor within a first database within the NVS2, the first group of data chunks; generating, by the processor, pointers identifying each data chunk of the first group of data chunks and an associated storage position, within the first database of the NVS2, for each the data chunk of the first group of data chunks; storing, by the processor within a second database within the NVS1, the pointers; first writing, by the processor from the NVS2 to the first data storage tape cartridge, the first group of data chunks for storage; and second writing, by the processor from the NVS1 to the first data storage tape cartridge, the pointers.

The present invention advantageously provides a simple method and associated system capable of implementing a data deduplication environment.

DETAILED DESCRIPTION

Figure 1:
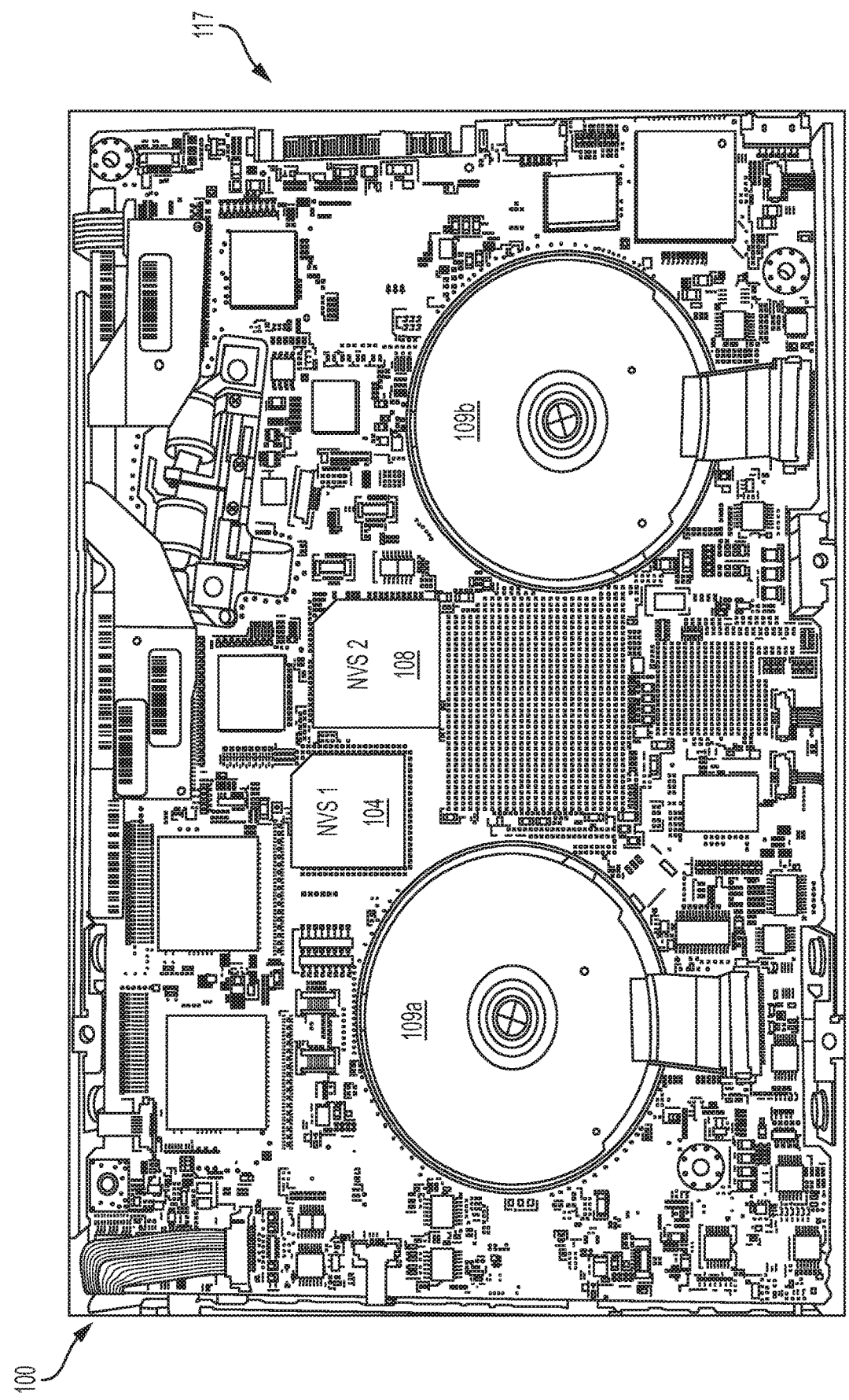
FIG. 1 illustrates a storage tape drive hardware device for improving a tape drive memory storage process, in accordance with embodiments of the present invention.

FIG. 1 illustrates a storage tape drive hardware device 100 for improving a tape drive memory storage process, in accordance with embodiments of the present invention. Typical de-duplication processes are usually associated with random accessible storage systems such as disk drives and flash memory devices. The de-duplication processes are typically applied to the aforementioned memory storage systems due to the ability of a de-duplication process to be performed at any time and data is able to be accessed without any delay. Executing a de-duplication process with respect to data stored on a tape drive storage device may result in tape drive storage limitations and speed issues. The aforementioned tape drive de-duplication process may cause de-duplication system performance issues thereby causing storage delays.

Data deduplication is defined herein as a specialized data compression technique for eliminating duplicate copies of repeating data portions (or chunks) from a data stream. A data de-duplication process is used to improve (tape drive device) memory storage utilization. A de-duplication process identifies and stores unique chunks of data or byte patterns during an analysis process. During the analysis process, additional data chunks are compared to the stored data chunks and whenever a match occurs, a duplicate (redundant) data chunk is replaced with a pointer (reference) that points to a location for the stored data chunk.

Storage tape drive hardware device 100 enables a mechanism for compressing data via a deduplication process executed directly within storage tape drive hardware device 100 without the need of a host or data management system. Storage tape drive hardware device 100 integrates a deduplication module internally comprising additional deduplication memory devices (i.e., non-volatile memory device 104 and non-volatile memory device 108) to temporary store depuplicated data chunks linked to reference pointers. During each data write execution, a deduplication software engine removes deduplicated data chunks from a data stream and replaces them with a pointer to the deduplication memory devices and when a data storage tape cartridge is full or is removed from storage tape drive hardware device 100, data content of the deduplication memory device is written to a reserved position of the data storage tape cartridge. Therefore, the data storage tape cartridge contains compressed data (i.e., data without the data chunks identified as duplicates) and all data from the deduplication memory device. When a data storage tape cartridge is mounted to storage tape drive hardware device 100, all detected reserved portions (of the data storage tape cartridge) are read thereby filling the deduplication memory device. Therefore, a data read process may be performed by reading compressed data and decoding the compressed data by replacing an associated pointer with data from the deduplication memory device.

Storage tape drive hardware device 100 of FIG. 1 includes a non-volatile memory device (NVS1) 104, a non-volatile memory device (NVS2) 108, tape drive motors 109a and 109b, and control circuitry 117 including a deduplication software engine for controlling all functionality associated with storage tape drive hardware device 100. NVS1 and NVS2 may comprise any type of specialized memory devices including, inter alia, an integrated circuit based memory device, a removable flash memory device, etc. Storage tape drive hardware device 100 may comprise an embedded computer or any type of specialized embedded hardware device. An embedded computer is defined herein as a dedicated computer comprising a combination of computer hardware and software (fixed in capability or programmable) specifically designed for executing a specialized function. Programmable embedded computers may comprise specialized programming interfaces. Additionally, storage tape drive hardware device 100 may comprise a specialized hardware device comprising specialized (non-generic) hardware and circuitry (i.e., specialized discrete non-generic analog, digital, and logic based circuitry) for executing a process described with respect to FIGS. 1-8. The specialized discrete non-generic analog, digital, and logic based circuitry may include proprietary specially designed components (e.g., a specialized integrated circuit designed for only implementing an automated process for improving tape drive memory storage process). Storage tape drive hardware device 100 of FIG. 1 includes specialized memory devices NVS1 104 and NVS2 108. The specialized memory may include a single memory system. Alternatively, the specialized memory may include a plurality of memory systems. Storage tape drive hardware device 100 may include sensors, processors, and additional software and specialized circuitry. Sensors may include, inter alia, storage sensors, optical sensors, speed sensors, etc.

Storage tape drive hardware device 100 enables a process for storing/buffering data sets within NVS2 108 prior to being written to a data storage tape cartridge such that during a data write process the stored/buffered data sets are analyzed by diving the datasets into larger segments such that each data segment comprises a collection of adjacent variable-length data chunks derived via execution of a chunking algorithm. The analyzed data segments are used to create a chunk-list file and compute one or more similarity identifiers for storage within an index. The chunk list file (i.e., a temporary repository) is stored within NVS1 104. During a process for directly streaming the contents of NVS2 108 to a (physical) data storage tape cartridge, storage tape drive hardware device 100 executes a process for the building chunk list file and initiates a counting process to determine matching data chunks located within a first few hundred mega bytes of data. The counting process is executed util a specified threshold is reached and all further identical data chunks are deleted from NVS2 108. Additionally, position pointers (i.e., pointing to a position within data storage tape cartridge) are written to NVS1 104. All data chinks deleted from NVS2 108 are written to data storage tape cartridge thereby improving the memory via a space saving process.

Figure 2:
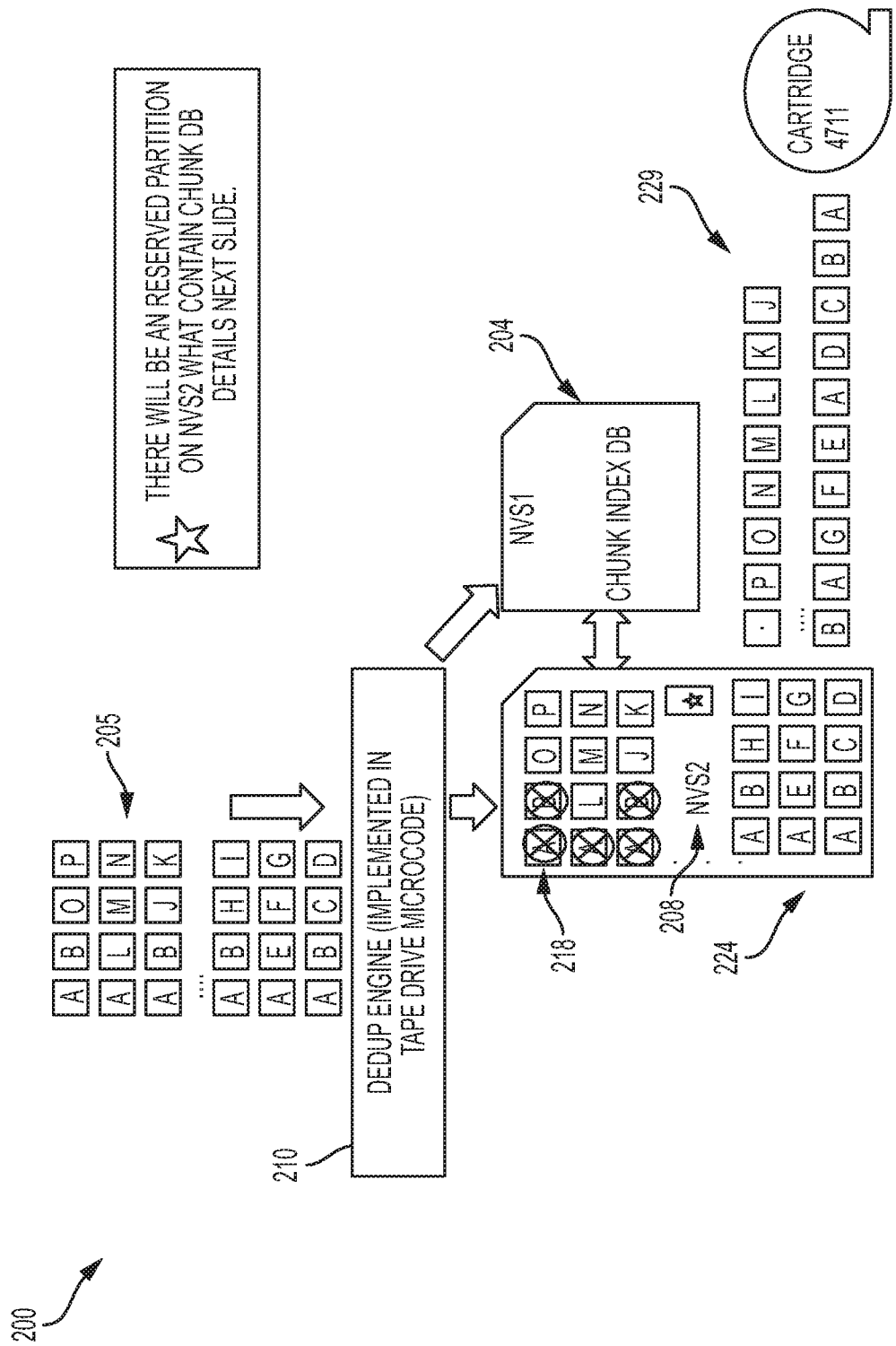
FIG. 2 illustrates a process for deduplicating and writing data via internal non-volatile memory devices, in accordance with embodiments of the present invention.

FIG. 2 illustrates a process 200 for deduplicating and writing data via NVS1 204 and NVS2 208, in accordance with embodiments of the present invention. Process 200 illustrates a data stream 205 received from a data host device. Data stream 205 is processed (within NVS2 208) by a deduplication software engine 210 (comprising software microcode) resulting in the deletion of data chunks "A" and "B" from NVS2 208. Additionally, a position pointer associated with the remaining data chunks 218 (being stored within tape cartridge 4711) is stored within a chunk index database within NVS1 204. A subsequent analysis is performed to analyze the incoming data stream 224 until a specified number (i.e., a threshold) of duplicate data chunks are identified. For example (with respect to FIG. 2), data chunk "A" has been identified three times and data chunk "B" has been identified two times. All remaining data chunks 229 are written to tape cartridge 4711.

Figure 3:
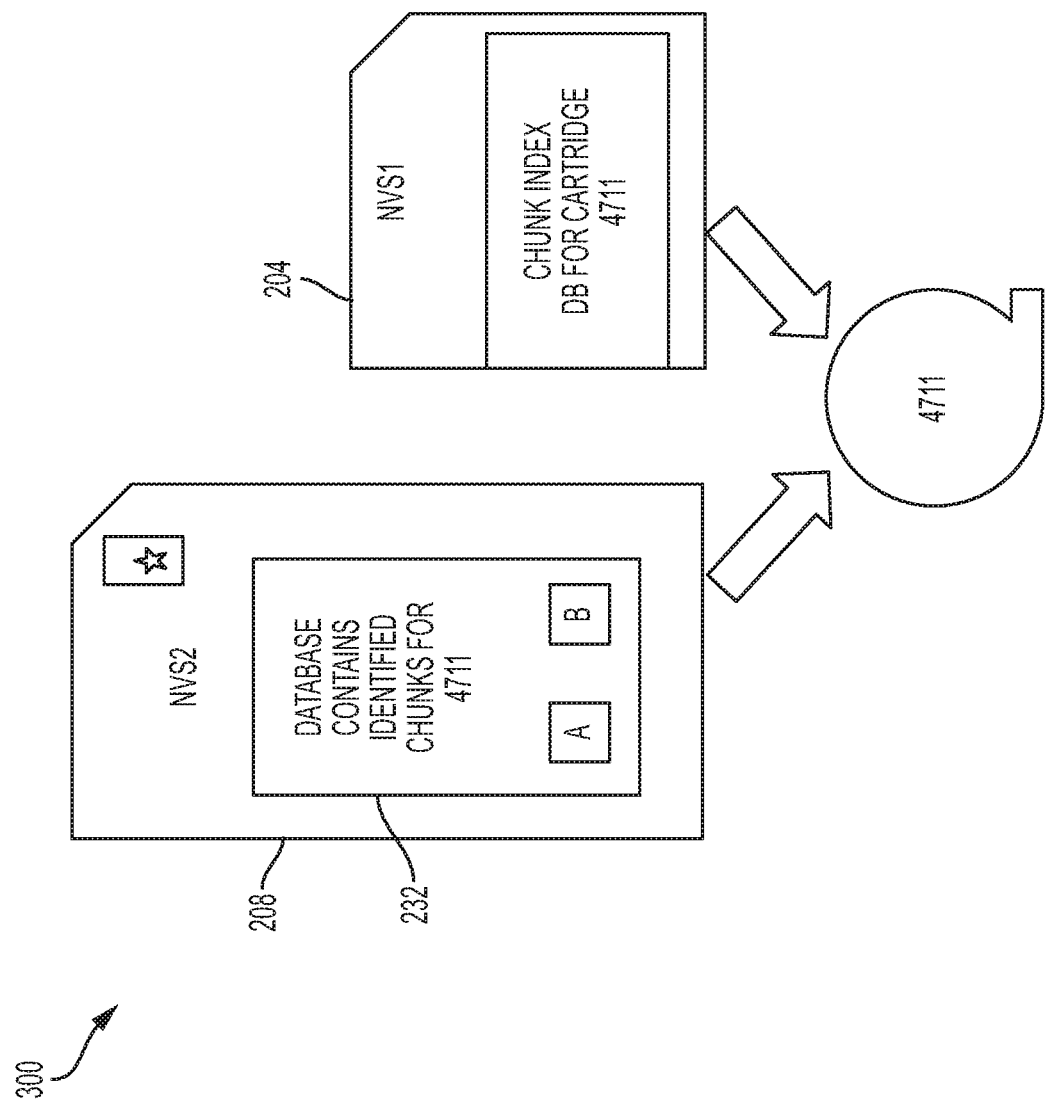
FIG. 3 illustrates a further process with respect to the process of FIG. 2, in accordance with embodiments of the present invention.

FIG. 3 illustrates a further process 300 with respect to process 200 of FIG. 2, in accordance with embodiments of the present invention. Process 300 illustrates a reserve partition 232 within NVS2. Reserve partition 232 includes a database comprising all identified duplicate data chunks "A" and "B" (i.e., identified during the process of FIG. 2). NVS1 204 comprises a chunk index database for tape cartridge 4711. A subsequent process is executed for writing contents of NVS1 204 and NVS2 208 to a specified location at a beginning portion of tape cartridge 4711.

Figure 4:
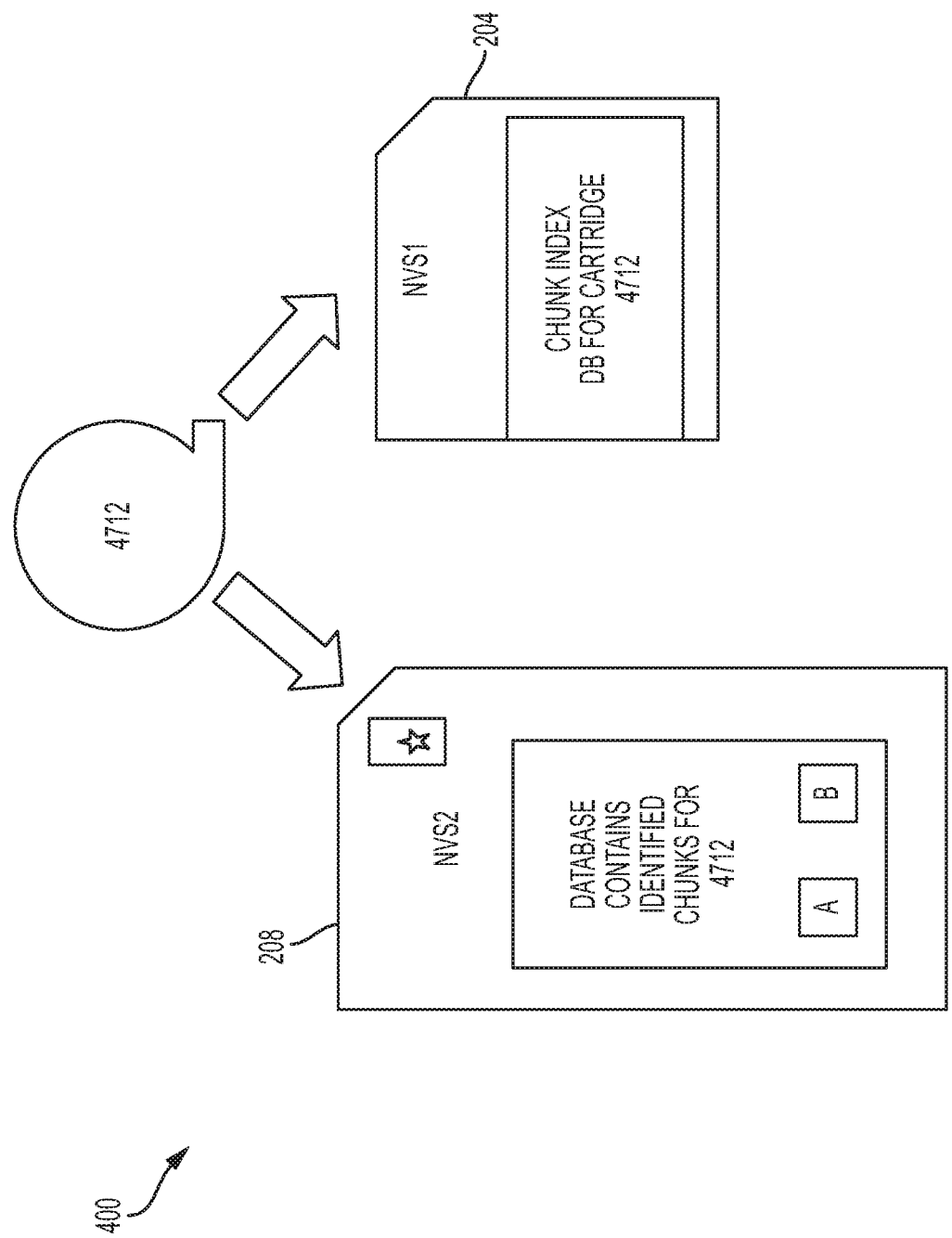
FIG. 4 illustrates a process for reading deduplicated data from a tape cartridge via internal non-volatile memory devices, in accordance with embodiments of the present invention.

FIG. 4 illustrates a process 400 for reading deduplicated data from a tape cartridge 4712 via NVS1 204 and NVS2 208, in accordance with embodiments of the present invention. Process 400 illustrates tape cartridge 4712 being mounted to a storage tape drive hardware device (e.g., storage tape drive hardware device 100 of FIG. 1) for executing a data read operation. A chunk database is read from tape cartridge 4712 to NVS2 208. An index database is read from tape cartridge 4712 to NVS1 204.

Figure 5:
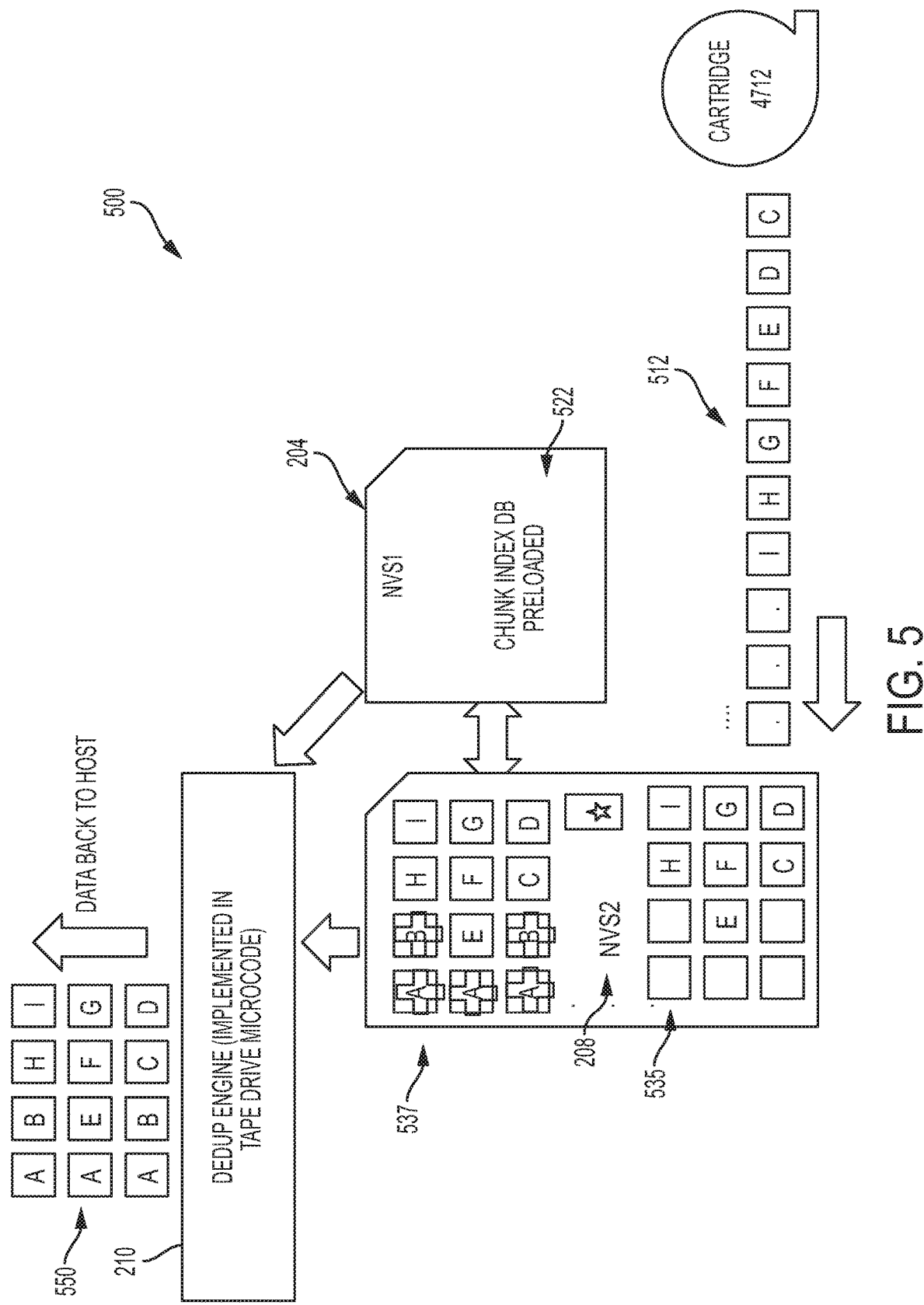
FIG. 5 illustrates a further process with respect to the process of FIG. 4, in accordance with embodiments of the present invention.

FIG. 5 illustrates a further process 500 with respect to process 400 of FIG. 4, in accordance with embodiments of the present invention. Process 500 illustrates reserve partition 232 within NVS2 preloaded with a chunk index database 522. The process is initiated when data chunks 512 are read back from tape cartridge 4712 to NVS2 208. Any gaps 535 (of data chunks 512) to be filled are identified and missing data chunks 537 are added to data chunks 512 based on information from the chunk index database 522 with respect to information from a reserved database of NVS2. Deduplication engine 210 transmits the complete data stream 550 back to a host device.

Figure 6:
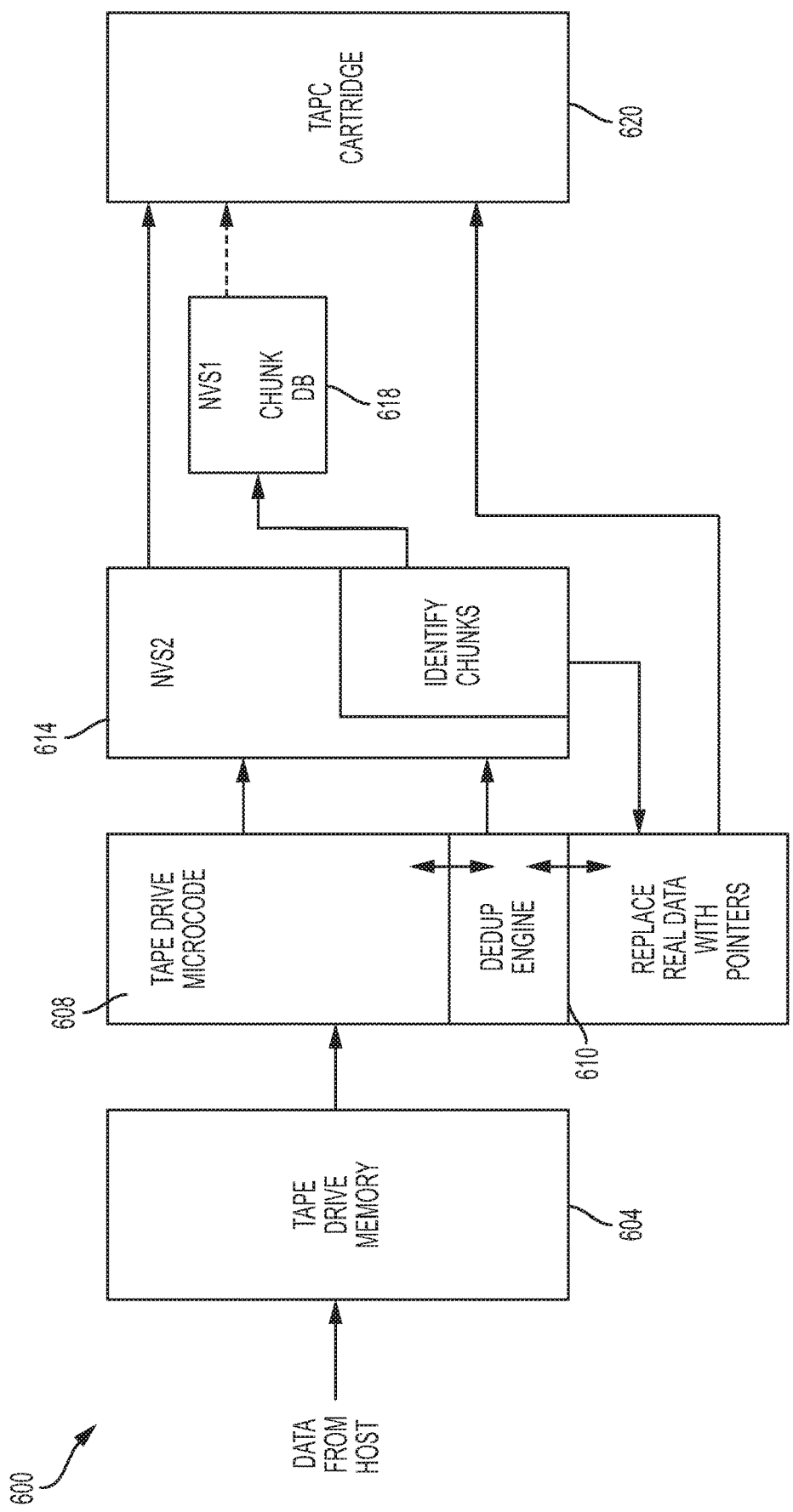
FIG. 6 illustrates a process executed within a storage tape drive hardware device, in accordance with embodiments of the present invention.

FIG. 6 illustrates a process executed within a storage tape drive hardware device 600, in accordance with embodiments of the present invention. Storage tape drive hardware device 600 comprises a tape drive memory unit 604 (comprising tape drive microcode 608 and a deduplication engine 610) connected to NVS2 614 and NVS1 618 for communications with a tape cartridge 620. The process is initiated when data is received (via tape drive memory 604) form a data host. Tape drive microcode 608 and deduplication engine 610 identify duplicate data chunks (within NVS2 614) and replace the duplicate data chunks with location pointers associated with NVS1 618. All remaining data chunks are stored within tape cartridge 620.

Figure 7:
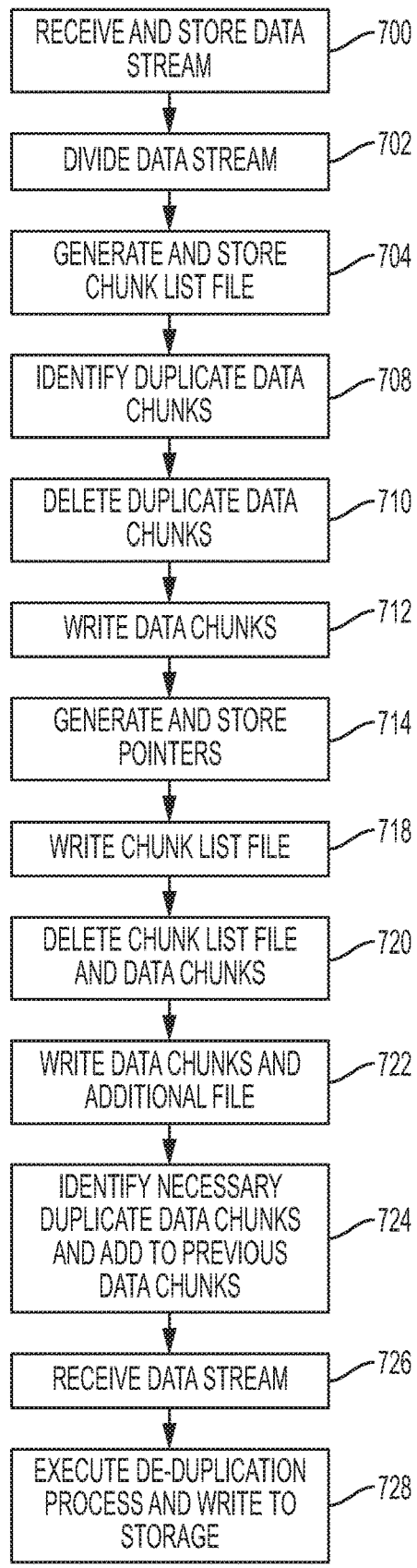
FIG. 7 illustrates an algorithm detailing a process flow enabled by the system of FIG. 1 for improving tape drive memory storage via execution of an internal data deduplication process, in accordance with embodiments of the present invention.

FIG. 7 illustrates an algorithm detailing a process flow enabled by system 100 of FIG. 1 for improving tape drive memory storage via execution of an internal data deduplication process, in accordance with embodiments of the present invention. Each of the steps in the algorithm of FIG. 7 may be enabled and executed in any order by a computer processor(s) executing computer code. In step 700, a data stream is received (by a storage tape drive hardware device) for storage. The storage tape drive hardware device internally comprises a deduplication software engine, a first non-volatile memory device (NVS1), a second non-volatile memory device (NVS2), and a first data storage tape cartridge. The data stream is stored within NVS2. NVS1 and NVS2 may comprise integrated circuit based memory devices. In step 702, the data stream is divided (within NVS2) into multiple adjacent variable length data chunks. In step 704, a chunk list file is generated. The chunk list file includes similarity identifiers associated with each of the adjacent variable length data chunks. The chunk list file is stored within NVS1. In step 708, duplicate data chunks of the adjacent variable length data chunks are identified (e.g., until a specified data storage size threshold with respect to the data stream has been exceeded). The duplicate data chunks comprise duplicated data with respect to a first group of data chunks of the adjacent variable length data chunks. In step 710, all further identical data chunks are deleted from NVS2 such that the first group of data chunks remains within NVS2. NVS2 may be partitioned such that the data stream is stored within a first partition of NVS2 and the first group of data chunks is stored within a second partition of NVS2. In step 712, the first group of data chunks is written from NVS2 to the first data storage tape cartridge for storage. In step 714, pointers identifying each data chunk of the first group of data chunks and an associated storage position (within the first data storage tape cartridge for each data chunk) are generated. The pointers are stored within the chunk list file located within NVS1. In step 718, the chunk list file comprising the pointers is written from NVS1 to the first data storage tape cartridge for storage. In step 720, the first data storage tape cartridge is removed from the storage tape drive hardware device and the chunk list file comprising the pointers is deleted from NVS1. Additionally, the chunk list file comprising the pointers is deleted from NVS2. In step 722, a second data storage tape cartridge is placed within the storage tape drive hardware device and a second group of de-duplicated data chunks is written from the second data storage tape cartridge to NVS2. Additionally, an additional chunk list file (comprising pointers identifying each data chunk of the second group of de-duplicated data chunks and an associated storage position) is written from the second data storage tape cartridge to NVS1. In step 724, necessary duplicate data chunks comprising duplicated data with respect to the group of de-duplicated data chunks are identified based on analysis of the additional chunk list file. The necessary duplicate data chunks are added to the second group of de-duplicated data chunks such that the second group of de-duplicated data chunks in combination with the necessary duplicate data chunks comprise a complete data file for execution. In step 726, the second data storage tape cartridge is removed from the storage tape drive hardware device, a third data storage tape cartridge is placed within the storage tape drive hardware device, and a second data stream is received for storage. In step 728, a de-duplication process with respect to the second data stream is executed based on the second group of de-duplicated data chunks of the NVS2 and the additional chunk list file of the NVS1. The de-duplication process results in a third group of de-duplicated data chunks for storage. The third group of de-duplicated data chunks is written to the third data storage tape cartridge for storage.

Figure 8:
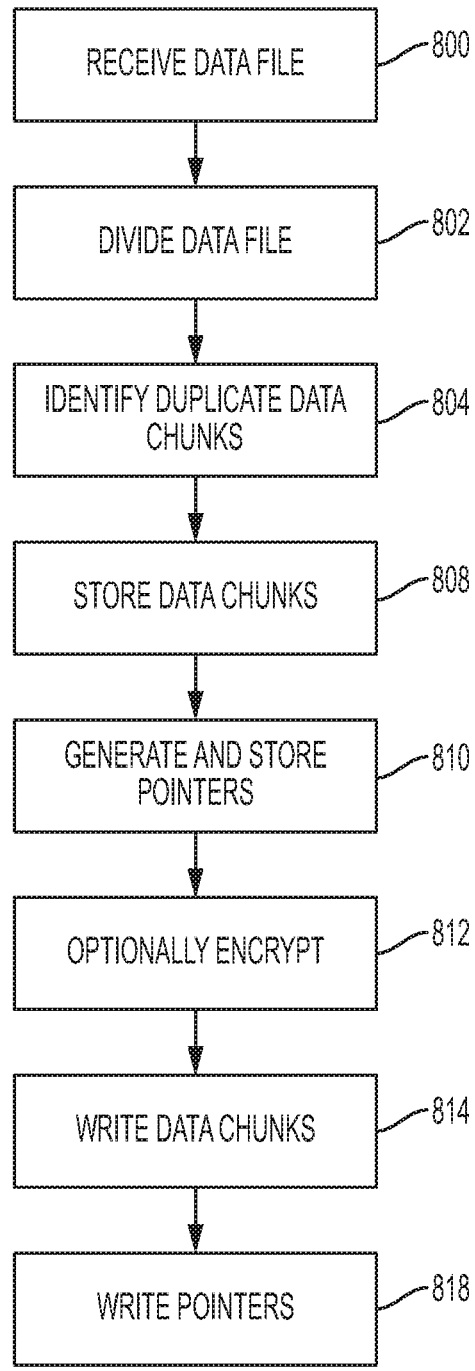
FIG. 8 illustrates an alternative algorithm to the algorithm of FIG. 7 for improving a tape drive memory storage via an internal data deduplication process, in accordance with embodiments of the present invention.

FIG. 8 illustrates an alternative algorithm to the algorithm of FIG. 7 detailing an alternative process flow enabled by system 100 of FIG. 1 for improving a tape drive memory storage via an internal data deduplication process, in accordance with embodiments of the present invention. Each of the steps in the algorithm of FIG. 8 may be enabled and executed in any order by a computer processor(s) executing computer code. In step 800, a data file is received (by a storage tape drive hardware device) for storage. The storage tape drive hardware device internally comprises a deduplication software engine, a first non-volatile memory device (NVS1), a second non-volatile memory device (NVS2), and a first data storage tape cartridge. In step 802, the data file is divided into a plurality of adjacent variable length data chunks. In step 804, duplicate data chunks (of the plurality of adjacent variable length data chunks) are identified. The duplicate data chunks include duplicated data with respect to a first group of data chunks of the plurality of adjacent variable length data chunk. In step 808, the first group of data chunks is stored within a first database within the NVS2. In step 810, pointers identifying each data chunk of the first group of data chunks and an associated storage position within the first database are generated. The pointers are stored within a second database within the NVS1. In optional step 812, the first group of data chunks and the pointers are encrypted. In step 814, the first group of data chunks are written from the NVS2 to the first data storage tape cartridge for storage. In step 818, the pointers are written from the NVS1 to the first data storage tape cartridge.

Figure 9:
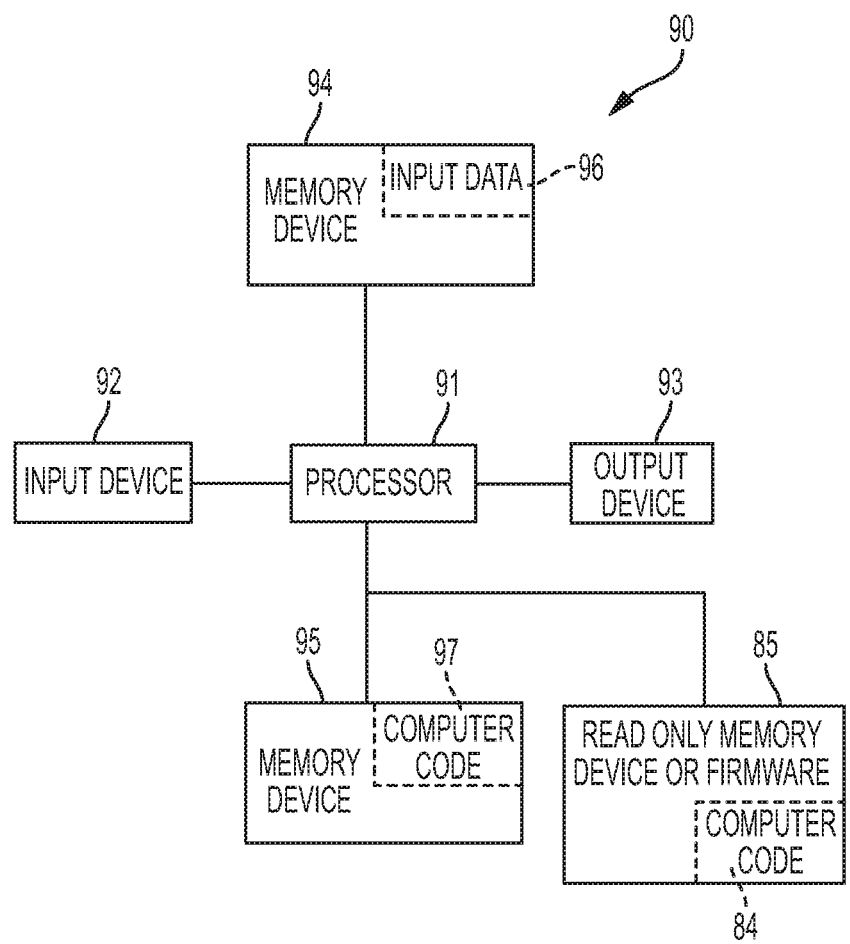
FIG. 9 illustrates a computer system used by or comprised by the system of FIG. 1 for improving a tape drive memory storage process, in accordance with embodiments of the present invention.

FIG. 9 illustrates a computer system 90 (e.g., storage tape drive hardware device) used by or comprised by the system of FIG. 1 for improving a tape drive memory storage process, in accordance with embodiments of the present invention.

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module," or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing apparatus receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, device (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing device to produce a machine, such that the instructions, which execute via the processor of the computer or other programmable data processing device, create means for implementing the functions/acts specified in the flowchart and/or block diagram block or blocks. These computer readable program instructions may also be stored in a computer readable storage medium that can direct a computer, a programmable data processing device, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing device, or other device to cause a series of operational steps to be performed on the computer, other programmable device or other device to produce a computer implemented process, such that the instructions which execute on the computer, other programmable device, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The computer system 90 illustrated in FIG. 9 includes a processor 91, an input device 92 coupled to the processor 91, an output device 93 coupled to the processor 91, and memory devices 94 and 95 each coupled to the processor 91. The input device 92 may be, inter alia, a keyboard, a mouse, a camera, a touchscreen, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital media disc (DVD), a dynamic random access memory (DRAM), a read-only memory (ROM), etc. The memory device 95 includes a computer code 97. The computer code 97 includes algorithms (e.g., the algorithms of FIGS. 7 and 8) for enabling a process for improving a tape drive memory storage process. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices Such as read only memory device 96) may include algorithms (e.g., the algorithms of FIGS. 7 and 8) and may be used as a computer usable medium (or a computer readable medium or a program storage device) having a computer readable program code embodied therein and/or having other data stored therein, wherein the computer readable program code includes the computer code 97. Generally, a computer program product (or, alternatively, an article of manufacture) of the computer system 90 may include the computer usable medium (or the program storage device).

In some embodiments, rather than being stored and accessed from a hard drive, optical disc or other writeable, rewriteable, or removable hardware memory device 95, stored computer program code 84 (e.g., including algorithms) may be stored on a static, nonremovable, read-only storage medium such as a Read-Only Memory (ROM) device 85, or may be accessed by processor 91 directly from such a static, nonremovable, read-only medium 85. Similarly, in some embodiments, stored computer program code 97 may be stored as computer-readable firmware 85, or may be accessed by processor 91 directly from such firmware 85, rather than from a more dynamic or removable hardware data-storage device 95, such as a hard drive or optical disc.

Still yet, any of the components of the present invention could be created, integrated, hosted, maintained, deployed, managed, serviced, etc. by a service supplier who offers to improve a tape drive memory storage process. Thus, the present invention discloses a process for deploying, creating, integrating, hosting, maintaining, and/or integrating computing infrastructure, including integrating computer-readable code into the computer system 90, wherein the code in combination with the computer system 90 is capable of performing a method for improving a tape drive memory storage process. In another embodiment, the invention provides a business method that performs the process steps of the invention on a subscription, advertising, and/or fee basis. That is, a service supplier, such as a Solution Integrator, could offer to enable a process for improving a tape drive memory storage process. In this case, the service supplier can create, maintain, support, etc. a computer infrastructure that performs the process steps of the invention for one or more customers. In return, the service supplier can receive payment from the customer(s) under a subscription and/or fee agreement and/or the service supplier can receive payment from the sale of advertising content to one or more third parties.

While FIG. 9 shows the computer system 90 as a particular configuration of hardware and software, any configuration of hardware and software, as would be known to a person of ordinary skill in the art, may be utilized for the purposes stated supra in conjunction with the particular computer system 90 of FIG. 9. For example, the memory devices 94 and 95 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A tape drive memory storage improvement method comprising:
    receiving, by a processor of a storage tape drive hardware device, a data stream, wherein said storage tape drive hardware device internally comprises a deduplication software engine, a first non-volatile memory device (NVS1), a second non-volatile memory device (NVS2), and a first data storage tape cartridge;
    passing, by said processor through said NVS2, said data stream;
    dividing, by said processor executing said deduplication software engine within said NVS2, said data stream into a plurality of adjacent variable length data chunks;
    storing, by said processor within said NVS1, a chunk list file comprising similarity identifiers associated with each of said plurality of adjacent variable length data chunks;
    identifying, by said processor, duplicate data chunks of said plurality of adjacent variable length data chunks, wherein said duplicate data chunks comprise duplicated data with respect to a first group of data chunks of said plurality of adjacent variable length data chunks;
    deleting, by said processor from said NVS2, said duplicate data chunks such that said first group of data chunks remain within said NVS2;
    writing, by said processor from said NVS2 to said first data storage tape cartridge, said first group of data chunks for storage;
    generating, by said processor, pointers identifying each data chunk of said first group of data chunks and an associated storage position, within said first data storage tape cartridge, for each said data chunk of said first group of data chunks;
    storing, by said processor, said pointers within said chunk list file located within said NVS1; and
    writing, by said processor from said NVS1 to said first data storage tape cartridge, said chunk list file comprising said pointers for storage.

2. The method of claim 1, wherein said first data storage tape cartridge is removed from said storage tape drive hardware device, and wherein said method further comprises:
    deleting, by said processor from said NVS1, said chunk list file comprising said pointers; and
    deleting, by said processor from said NVS2, said first group of data chunks.

3. The method of claim 2, wherein a second data storage tape cartridge is placed within said storage tape drive hardware device, and wherein said method further comprises:
    writing, by said processor from said second data storage tape cartridge to said NVS2, a second group of de-duplicated data chunks;
    writing, by said processor from said second data storage tape cartridge to said NVS1, an additional chunk list file comprising pointers identifying each data chunk of said second group of de-duplicated data chunks and an associated storage position;

identifying, by said processor based on analysis of said additional chunk list file, necessary duplicate data chunks comprising duplicated data with respect to said second group of de-duplicated data chunks; and adding, by said processor to said second group of de-duplicated data chunks, said necessary duplicate data chunks such that said second group of de-duplicated data chunks in combination with said necessary duplicate data chunks comprise a complete data file for execution.

4. The method of claim 3, wherein said second data storage tape cartridge is removed from said storage tape drive hardware device, wherein a third data storage tape cartridge is placed within said storage tape drive hardware device, and wherein said method further comprises:

receiving, by said processor, a second data stream for storage;

executing, by said processor based on said second group of de-duplicated data chunks of said NVS2 and said additional chunk list file of said NVS1, a de-duplication process with respect to said second data stream resulting in a third group of de-duplicated data chunks for storage; and writing, by said processor to said third data storage tape cartridge, said third group of de-duplicated data chunks for storage.

5. The method of claim 1, wherein said identifying is executed until a specified data storage size threshold with respect to said data stream has been exceeded.

6. The method of claim 1, further comprising:

partitioning, by said processor said NVS2 such that said data stream is stored within a first partition of said NVS2 and said first group of data chunks is stored within a second partition of said NVS2.

7. The method of claim 1, wherein said NVS1 comprises a first integrated circuit based memory device, and wherein said NVS2 comprises a second integrated circuit based memory device.

8. The method of claim 1, further comprising:

providing at least one support service for at least one of creating, integrating, hosting, maintaining, and deploying computer-readable code in the storage tape drive hardware device, said code being executed by the processor to implement: said receiving, said storing said data stream, said dividing, said storing said chunk list file, said identifying, said deleting, said writing said first group of data chunks, said generating said pointers, said storing said pointers, and said writing said chunk list file.

9. A computer program product, comprising a computer readable hardware storage device storing a computer readable program code, said computer readable program code comprising an algorithm that when executed by a processor of a storage tape drive hardware device implements a tape drive memory storage improvement method, said method comprising:

receiving, by said processor, a data stream for storage, wherein said storage tape drive hardware device internally comprises a deduplication software engine, a first non-volatile memory device (NVS1), a second non-volatile memory device (NVS2), and a first data storage tape cartridge;

passing, by said processor through said NVS2, said data stream;

dividing, by said processor executing said deduplication software engine within said NVS2, said data stream into a plurality of adjacent variable length data chunks;

storing, by said processor within said NVS1, a chunk list file comprising similarity identifiers associated with each of said plurality of adjacent variable length data chunks;

identifying, by said processor, duplicate data chunks of said plurality of adjacent variable length data chunks, wherein said duplicate data chunks comprise duplicated data with respect to a first group of data chunks of said plurality of adjacent variable length data chunks;

deleting, by said processor from said NVS2, said duplicate data chunks such that said first group of data chunks remain within said NVS2;

writing, by said processor from said NVS2 to said first data storage tape cartridge, said first group of data chunks for storage;

generating, by said processor, pointers identifying each data chunk of said first group of data chunks and an associated storage position, within said first data storage tape cartridge, for each said data chunk of said first group of data chunks;

storing, by said processor, said pointers within said chunk list file located within said NVS1; and writing, by said processor from said NVS1 to said first data storage tape cartridge, said chunk list file comprising said pointers for storage.

10. The computer program product of claim 9, wherein said first data storage tape cartridge is removed from said storage tape drive hardware device, and wherein said method further comprises:

deleting, by said processor from said NVS1, said chunk list file comprising said pointers; and deleting, by said processor from said NVS2, said first group of data chunks.

11. The computer program product of claim 10, wherein a second data storage tape cartridge is placed within said storage tape drive hardware device, and wherein said method further comprises:

writing, by said processor from said second data storage tape cartridge to said NVS2, a second group of de-duplicated data chunks;

writing, by said processor from said second data storage tape cartridge to said NVS1, an additional chunk list file comprising pointers identifying each data chunk of said second group of de-duplicated data chunks and an associated storage position; and identifying, by said processor based on analysis of said additional chunk list file, necessary duplicate data chunks comprising duplicated data with respect to said second group of de-duplicated data chunks; and adding, by said processor to said second group of de-duplicated data chunks, said necessary duplicate data chunks such that said second group of de-duplicated data chunks in combination with said necessary duplicate data chunks comprise a complete data file for execution.

12. The computer program product of claim 11, wherein said second data storage tape cartridge is removed from said storage tape drive hardware device, wherein a third data storage tape cartridge is placed within said storage tape drive hardware device, and wherein said method further comprises:

receiving, by said processor, a second data stream for storage;

executing, by said processor based on said second group of de-duplicated data chunks of said NVS2 and said additional chunk list file of said NVS1, a de-duplication process with respect to said second data stream resulting in a third group of de-duplicated data chunks for storage; and writing, by said processor to said third data storage tape cartridge, said third group of de-duplicated data chunks for storage.

13. The computer program product of claim 9, wherein said identifying is executed until a specified data storage size threshold with respect to said data stream has been exceeded.

14. The computer program product of claim 9, wherein said method further comprises:

partitioning, by said processor said NVS2 such that said data stream is stored within a first partition of said NVS2 and said first group of data chunks is stored within a second partition of said NVS2.

15. The computer program product of claim 9, wherein said NVS1 comprises a first integrated circuit based memory device, and wherein said NVS2 comprises a second integrated circuit based memory device.

16. A storage tape drive hardware device comprising a processor coupled to a computer-readable memory unit, said memory unit comprising instructions that when executed by the processor implements a tape drive memory storage improvement method comprising:

receiving, by said processor, a data stream for storage, wherein said storage tape drive hardware device internally comprises a deduplication software engine, a first non-volatile memory device (NVS1), a second non-volatile memory device (NVS2), and a first data storage tape cartridge;

passing, by said processor through said NVS2, said data stream;

dividing, by said processor executing said deduplication software engine within said NVS2, said data stream into a plurality of adjacent variable length data chunks;

storing, by said processor within said NVS1, a chunk list file comprising similarity identifiers associated with each of said plurality of adjacent variable length data chunks;

identifying, by said processor, duplicate data chunks of said plurality of adjacent variable length data chunks, wherein said duplicate data chunks comprise duplicated data with respect to a first group of data chunks of said plurality of adjacent variable length data chunks;

deleting, by said processor from said NVS2, said duplicate data chunks such that said first group of data chunks remain within said NVS2;

writing, by said processor from said NVS2 to said first data storage tape cartridge, said first group of data chunks for storage;

generating, by said processor, pointers identifying each data chunk of said first group of data chunks and an associated storage position, within said first data storage tape cartridge, for each said data chunk of said first group of data chunks;

storing, by said processor, said pointers within said chunk list file located within said NVS1; and writing, by said processor from said NVS1 to said first data storage tape cartridge, said chunk list file comprising said pointers for storage.

17. The storage tape drive hardware device of claim 16, wherein said first data storage tape cartridge is removed from said storage tape drive hardware device, and wherein said method further comprises:

deleting, by said processor from said NVS1, said chunk list file comprising said pointers; and deleting, by said processor from said NVS2, said first group of data chunks.

18. The storage tape drive hardware device of claim 17, wherein a second data storage tape cartridge is placed within said storage tape drive hardware device, and wherein said method further comprises:

writing, by said processor from said second data storage tape cartridge to said NVS2, a second group of de-duplicated data chunks;

writing, by said processor from said second data storage tape cartridge to said NVS1, an additional chunk list file comprising pointers identifying each data chunk of said second group of de-duplicated data chunks and an associated storage position; and identifying, by said processor based on analysis of said additional chunk list file, necessary duplicate data chunks comprising duplicated data with respect to said second group of de-duplicated data chunks; and adding, by said processor to said second group of de-duplicated data chunks, said necessary duplicate data chunks such that said second group of de-duplicated data chunks in combination with said necessary duplicate data chunks comprise a complete data file for execution.

19. The storage tape drive hardware device of claim 18, wherein said second data storage tape cartridge is removed from said storage tape drive hardware device, wherein a third data storage tape cartridge is placed within said storage tape drive hardware device, and wherein said method further comprises:

receiving, by said processor, a second data stream for storage;

executing, by said processor based on said second group of de-duplicated data chunks of said NVS2 and said additional chunk list file of said NVS1, a de-duplication process with respect to said second data stream resulting in a third group of de-duplicated data chunks for storage; and writing, by said processor to said third data storage tape cartridge, said third group of de-duplicated data chunks for storage.

20. The storage tape drive hardware device of claim 16, wherein said identifying is executed until a specified data storage size threshold with respect to said data stream has been exceeded.

21. A tape drive memory storage improvement method comprising:

receiving, by a processor of a storage tape drive hardware device, a data file for storage, wherein said storage tape drive hardware device internally comprises a deduplication software engine, a first non-volatile memory device (NVS1), a second non-volatile memory device (NVS2), and a first data storage tape cartridge;

dividing, by said processor executing said deduplication software engine, said data file into a plurality of adjacent variable length data chunks;

identifying, by said processor executing said deduplication software engine, duplicate data chunks of said plurality of adjacent variable length data chunks, wherein said duplicate data chunks comprise duplicated data with respect to a first group of data chunks of said plurality of adjacent variable length data chunks;

storing, by said processor within a first database within said NVS2, said first group of data chunks;

storing, by said processor within a second database within said NVS1, pointers identifying each data chunk of said first group of data chunks and an associated storage position, within said first database of said NVS2, for each said data chunk of said first group of data chunks;

first writing, by said processor from said NVS2 to said first data storage tape cartridge, said first group of data chunks for storage; and second writing, by said processor from said NVS1 to said first data storage tape cartridge, said pointers.

22. The method of claim 21, further comprising:

before said first writing, encrypting by said processor, said first group of data chunks; and before said second writing, encrypting by said processor, said pointers.

23. The method of claim 21, wherein each of said NVS1 and said NVS2 comprises a memory device selected from the group consisting of an integrated circuit based memory device and a removable flash memory device.

24. A computer program product, comprising a computer readable hardware storage device storing a computer readable program code, said computer readable program code comprising an algorithm that when executed by a processor of a storage tape drive hardware device implements a tape drive memory storage improvement method, said method comprising:

receiving, by said processor, a data file for storage, wherein said storage tape drive hardware device internally comprises a deduplication software engine, a first non-volatile memory device (NVS1), a second non-volatile memory device (NVS2), and a first data storage tape cartridge;

dividing, by said processor executing said deduplication software engine, said data file into a plurality of adjacent variable length data chunks;

identifying, by said processor executing said deduplication software engine, duplicate data chunks of said plurality of adjacent variable length data chunks, wherein said duplicate data chunks comprise duplicated data with respect to a first group of data chunks of said plurality of adjacent variable length data chunks;

storing, by said processor within a first database within said NVS2, said first group of data chunks;

storing, by said processor within a second database within said NVS1, pointers identifying each data chunk of said first group of data chunks and an associated storage position, within said first database of said NVS2, for each said data chunk of said first group of data chunks;

first writing, by said processor from said NVS2 to said first data storage tape cartridge, said first group of data chunks for storage; and second writing, by said processor from said NVS1 to said first data storage tape cartridge, said pointers.

25. The computer program product of claim 24, wherein each of said NVS1 and said NVS2 comprises a memory device selected from the group consisting of an integrated circuit based memory device and a removable flash memory device.

* * * * *